(12) United States Patent
Busson et al.

(10) Patent No.: US 7,962,949 B2
(45) Date of Patent: Jun. 14, 2011

(54) ELECTRONIC COMPONENT ALLOWING THE DECODING OF DIGITAL TERRESTRIAL OR CABLE TELEVISION SIGNALS

(75) Inventors: Pierre Busson, Grenoble (FR); Daniel Saias, Paris (FR); Frederic Paillardet, Aix les Bains (FR); Franck Montaudon, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 1748 days.

(21) Appl. No.: 10/814,621

(22) Filed: Mar. 31, 2004

(65) Prior Publication Data
US 2004/0257480 A1 Dec. 23, 2004

(30) Foreign Application Priority Data

Apr. 3, 2003 (FR) ..................... 03 04138

(51) Int. Cl.
*H04N 7/16* (2011.01)
*H04N 5/50* (2006.01)
*H04H 20/74* (2008.01)

(52) U.S. Cl. ........ 725/151; 725/131; 725/139; 348/731; 455/3.02

(58) Field of Classification Search .................. 725/131, 725/139, 151; 348/731; 455/3.02
See application file for complete search history.

(56) References Cited

U.S. PATENT DOCUMENTS

| 5,487,089 | A | * | 1/1996 | Misaizu et al. ............... 375/296 |
| 5,517,529 | A | | 5/1996 | Stehlik |
| 5,671,220 | A | | 9/1997 | Tonomura |
| 5,796,147 | A | | 8/1998 | Ono |
| 5,857,004 | A | | 1/1999 | Abe |
| 5,953,636 | A | * | 9/1999 | Keate et al. .................. 455/3.02 |
| 6,131,023 | A | | 10/2000 | Matsuura |
| 6,400,416 | B1 | * | 6/2002 | Tomasz ......................... 348/654 |
| 6,603,807 | B1 | | 8/2003 | Yukutake et al. |
| 7,034,731 | B2 | * | 4/2006 | Uramoto et al. .............. 341/143 |
| 7,167,694 | B2 | | 1/2007 | Khoini-Poorfard et al. |
| 2003/0053562 | A1 | | 3/2003 | Busson et al. |
| 2007/0182866 | A1 | * | 8/2007 | Birleson et al. ............... 348/725 |

OTHER PUBLICATIONS

ISSCC 98/Paper FP 13.1; L. Tan et al ; A 70Mb/s variable-rate 1024-QAM Cable receiver IC with Integrated 10b ADC and FEC decoder; Feb. 6, 1998.*

Yamamoto, et al., "Wide Band and Low Supply Voltage ICs for Satellite Tuner Unit", Consumer Electronics, 1992, Digest of Technical Papers., ICCE., IEEE 1992, International Conference on Rosemont, Ilinois, USA Jun. 2-4, 1992, New York, NY, IEEE, Jun. 2, 1992, pp. 190-191, XP010102878.

French Search Report, FR 03 04138, dated Oct. 1, 2003.

Poulton, et al., "A 4GSample/s 8b ADC in 0.35um CMOS", ISSCC 2002, pp. 166-457, XP010585513.

Nguyen, C. T.-C., Micromechanical Resonators for Oscillators and Filters, 1995 IEEE Ultrasonics Symposium, Proceedings, Nov. 7, 1995, pp. 489-499, XP010157252.

(Continued)

*Primary Examiner* — Joseph P Hirl
*Assistant Examiner* — Fred Peng
(74) *Attorney, Agent, or Firm* — Gardere Wynne & Sewell LLP; Andre M. Szuwalski

(57) ABSTRACT

A dual-conversion tuner firstly upconverts so as to place itself outside the receive band and then downconverts with zero intermediate frequency. A filter of the surface acoustic wave type is disposed between the two frequency transposition stages of the tuner. After baseband filtering, the signals are digitized then processed in a digital block comprising a channel decoding module. With the exception of the surface acoustic wave filter, the components are entirely embodied in integrated fashion.

24 Claims, 3 Drawing Sheets

OTHER PUBLICATIONS

L. Tan, et al., ISSCC 98/Paper FP 13.1: A 70Mb/s variable-rate 1024-QAM Cable receiver IC with Integrated 10b ADC and FEC decoder, Feb. 6, 1998.

L. Tan, et al., A 70-Mb/s Variable-Rate 1024-QAM Cable Receiver IC with Integrated 10-b ADC and FEC Decoder; IEEE Journal of Solid-State Circuits, vol. 33, No. 12, pp. 2205-2218, dated Dec. 1998.

* cited by examiner

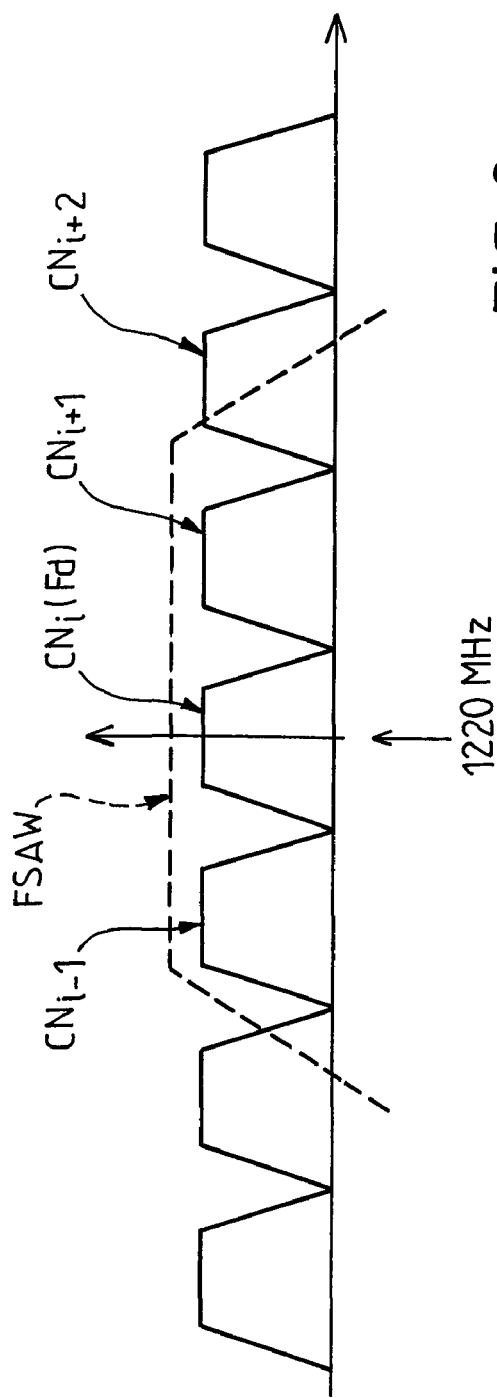
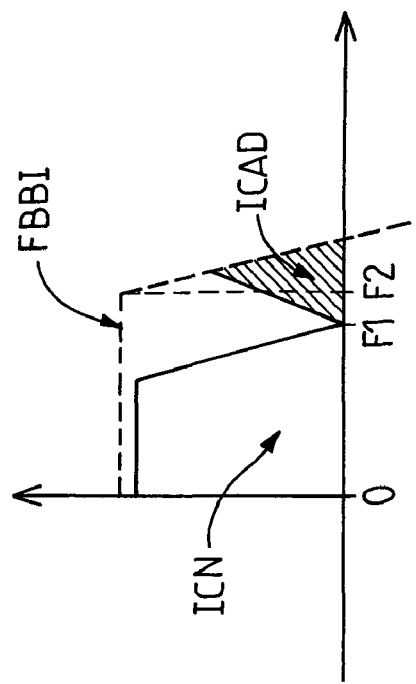

ELECTRONIC COMPONENT ALLOWING THE DECODING OF DIGITAL TERRESTRIAL OR CABLE TELEVISION SIGNALS

PRIORITY CLAIM

The present application claims priority from French Application for Patent No. 03 04138 filed Apr. 3, 2003, the disclosure of which is hereby incorporated by reference.

BACKGROUND OF THE INVENTION

1. Technical Field of the Invention

The present invention relates to the decoding of radiofrequency transmission channels conveying coded digital information.

The invention thus applies advantageously to digital terrestrial television, that is to say using signals transmitted between television antennas, as defined, for example, in the European DVB-T (Digital Video Broadcasting—Terrestrial) specification, or to digital cable television, as defined, for example, in the European DVB-C (Digital Video Broadcasting—Cable) specification, all these telebroadcasts being based on the MPEG transmission standards, and use for example to convey information, quadrature digital modulation, or modulation of the COFDM type according to terminology well known to the person skilled in the art. The invention thus relates in particular to tuners, and also to demodulators and to the actual processing for channel decoding.

2. Description of Related Art

The television signals received at the input of the tuner of the receiver are composed of the entire set of transmitted channels that lie in the 50 MHz-850 MHz frequency band.

The objective of the tuner is to select the desired channel and to output a baseband signal on the in-phase path (I path) and on the quadrature path (Q path). This signal is thereafter converted into a digital signal and demodulated. The channel decoding processing thereafter also comprises a block which distinguishes, typically by means of majority logic, zeros from ones, then performs all the error correction, that is to say typically a Viterbi decoding, deinterleaving, Reed-Solomon decoding and deshuffling. The channel decoding device outputs packets that are decoded in a conventional manner in a source decoding device in accordance with the MPEG standards so as to regenerate the initial audio and video signals transmitted via antennas or via the cable.

Current studies are aimed at researching ever more integrated solutions for embodying digital terrestrial or cable receivers. However, this research is confronted by technological difficulties related to the embodying of the means making it possible, on the one hand, to correctly discern a channel from the entire set of channels present, and, on the other hand, to correctly discriminate the signal from noise.

Specifically, whereas in digital satellite television, all the channels have nearly the same power, this is not the case in particular in digital terrestrial television. Thus, it is for example possible to have adjacent channels exhibiting a very high power with respect to the desired channel, for example a difference in power of the order of 35 dB. It is therefore necessary to be able to ensure a rejection of 35 dB on the adjacent channels. Moreover, the specification imposes a signal/noise ratio of the order of 35 dB. Hence, in the worst case, it is therefore essential for it to be possible to bring the level of an adjacent channel to 70 dB below its input level.

This results in extremely significant constraints on the filters, this being extremely constraining in respect of integrated solutions. The invention aims to afford a solution to this problem. There is a need in the art to present a solution offering maximum integration, given the characteristics of digital television signals, in particular terrestrial ones, exhibiting more significant rejection constraints than digital cable television signals.

SUMMARY OF THE INVENTION

The invention therefore proposes an electronic component comprising
a tuning module, or tuner, of the zero intermediate frequency dual conversion, upconversion then downconversion, type, possessing an input able to receive digital terrestrial or cable television analog signals composed of several channels, a bandpass filter of the surface acoustic wave type disposed between the two frequency transposition stages of the tuning module, and delivering a filtered analog signal containing the information conveyed by a desired channel and so-called "adjacent channel" information, a baseband filtering stage disposed on the two quadrature output paths of the second frequency transposition stage for performing a first filtering of the adjacent channel information,
a multibit analog/digital conversion stage linked to the output of the baseband filtering stage,
a digital block comprising a stage for correcting the defects of phase- and amplitude-pairing of the two processing paths, and a channel decoding digital module linked to the output of the defect correcting stage, this digital decoding module comprising a demodulation stage, a digital filtering stage for eliminating the said adjacent channel information, and an error correcting stage for delivering a stream of data packets corresponding to the information conveyed by the desired channel.

Moreover, with the exception of the surface acoustic wave filter, the tuning module, the analog/digital conversion stage and the digital block are disposed within an integrated circuit embodied on a monolithic substrate.

Stated otherwise, the invention solves in particular the problem of the filtering of the adjacent channels by using in combination, an external filter of the surface acoustic wave type (SAW filter), an integrated baseband filter, and a digital filter. Thus, the surface acoustic wave filter, which is by nature a relatively steep filter, performs a prefiltering of the signal so as to allow through only the desired channel and a few adjacent channels. Then, the elimination of the adjacent channels proceeds with the baseband analog filter which is a relatively soft filter, and terminates with the digital filter (Nyquist filter) at the output of which the adjacent channel information is eliminated.

Moreover, the multibit resolution of the analog/digital conversion stage, for example at least equal to four bits, allows sufficient accuracy to be obtained ultimately, with regard to the information of the desired channel.

Thus, the distribution of the adjacent channel filtering function according to the invention helps to allow the embodying, on one and the same chip, of all the components of the receiver, and to retain only the surface acoustic wave filter as external component.

According to one embodiment of the invention, the first frequency transposition stage is able to receive a first transposition signal having a frequency equal for example to the sum of the frequency of the desired channel and of a first transposition frequency greater than the upper limit of the said frequency span. It will be possible to choose for example a first transposition frequency equal to 1220 MHz.

This said, it could also be possible for the frequency of the transposition signal to be equal to the difference between the first transposition frequency and the frequency of the desired channel.

Choosing a first transposition frequency greater than the upper limit of the frequency span, that is to say greater than 850 MHz, makes it possible to proceed with this upconversion, outside the receive band, and thus to avoid interactions with the first transposition frequency.

Moreover, the second frequency transposition stage, that is to say the one that will bring the signal back to baseband, is able to receive a second transposition signal having the said first transposition frequency, that is to say in this instance 1220 MHz.

The passband of the surface acoustic wave filter is for example of the order of two to three times the frequency width of a channel. Thus, by way of indication, the frequency width of a channel being of the order of 8 MHz, it will be possible to choose a passband of the order of 20 MHz for the surface acoustic wave filter.

For its part, the bandpass filtering stage possesses an upper cutoff frequency of around 20% greater than the frequency half-width of a channel.

Moreover, although the sampling frequency of the analog/digital conversion stage is advantageously greater than around 2.5 times the upper cutoff frequency of the baseband filtering stage, it is particularly advantageous to provide a much higher sampling frequency, for example of the order of some 100 MHz and more generally at least ten times greater than the upper cutoff frequency of the baseband filtering stage, so as to perform an oversampling of the signal. Thus, this oversampling, in combination with a multibit resolution, makes it possible, in particular when a decimater filter is disposed downstream of the analog/digital converter, to extract the desired channel with a multibit resolution, and hence to be able to correctly utilize the information contained in this desired channel.

According to one embodiment of the invention, the cutoff frequency of the digital filtering stage is equal to the frequency half-width of a channel.

According to one embodiment of the invention, the component comprises a metal plate glued to the rear surface of the substrate by a conducting glue, this metal plate being intended to be grounded. Thus, the capacitance, of relatively high value, produced between the semiconductor substrate and the metal plate, makes it possible to absorb the high-frequency current spikes.

Moreover, it is particularly advantageous for the elements performing a digital processing to be disposed in a part of the substrate that is isolated from the remaining part of the substrate by a semiconducting barrier having a type of conductivity different from the type of conductivity of the substrate. Stated otherwise, a so-called "triple well" technology is used. This makes it possible, when the semiconducting barrier is biased by a bias voltage different from that supplying the transistors situated in the isolated part of the substrate, to prevent noise on the supply voltage of the transistors from being transmitted directly via the substrate to the various analog components of the receiver.

The subject of the invention is also a terrestrial or cable digital television signal receiver, comprising an electronic component as defined hereinabove.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 2 diagrammatically illustrates s frequency chart of channels before and after filtering;

FIG. 3 diagrammatically illustrates s frequency chart of channels before and after filtering;

DETAILED DESCRIPTION OF THE DRAWINGS

Figure 1:
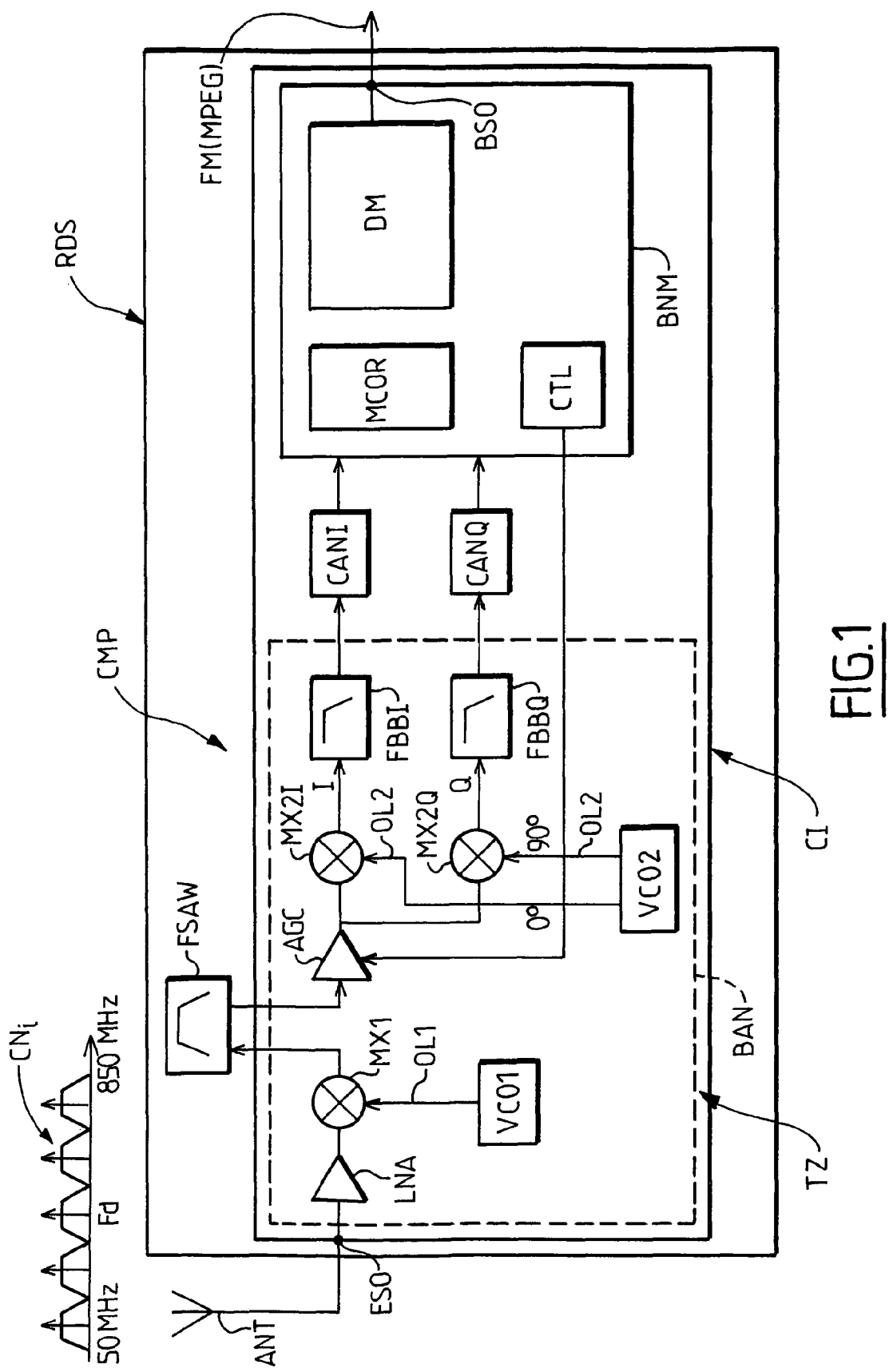
FIG. 1 is a schematic of the internal structure of an electronic component according to the invention.

In FIG. 1, the reference RDS denotes a receiver/decoder connected to a antenna ANT picking up digital terrestrial television signals, this receiver being intended to receive and to decode these signals. The receiver RDS comprises at the head end an electronic component CMP intended to receive all the channels $CN_i$ present in the signal received at the signal input ESO of this component, and to deliver, at the output BSO, an MPEG data stream corresponding to a selected channel.

The component CMP comprises an integrated circuit IC (chip) embodied entirely in CMOS technology on a monolithic silicon substrate. The component CMP comprises at the head end a tuning device or "tuner" TZ, intended for selecting a channel from all the channels $CN_i$ present in the signal received at the signal input ESO, which here is also the input of the tuner. This tuner TZ is here a dual-conversion tuner, first upconversion then downconversion with zero intermediate frequency, so as to ultimately bring the signal back to baseband. More precisely, the tuner TZ comprises an analog block BAN, separated from a digital block BNM by an analog/digital conversion stage CANI and CANQ. The analog block BAN, the digital block BNM and the analog/digital conversion stage CANI and CANQ are embodied on the chip IC.

The tuner TZ comprises at the head end a low noise amplifier LNA connected to the signal input ESO. This amplifier LNA is followed by a first frequency transposition stage (mixer) MX1. This mixer MX1 receives, on the one hand, the signal emanating from the low noise amplifier LNA and, on the other hand, a transposition signal OL1 emanating for example from a voltage-controlled oscillator VCO1. This transposition signal OL1 has a frequency equal to the sum of the frequency Fd of the desired channel and of a first transposition frequency which is chosen to be greater than the upper limit of the 50 MHz-850 MHz frequency span. By way of example, a frequency equal to 1220 MHz may be chosen as first transposition frequency. Consequently, the signal at the output of the mixer MX1 is, as illustrated in FIG. 2, a signal comprising all the channels, but whose desired channel $CN_i$ is centered around the first transposition frequency, that is to say 1220 MHz.

One then proceeds to a first bandpass filtering of the signal emanating from the mixer MX1 in an external filter of the surface acoustic wave type FSAW. This filter is external, in the sense that it is situated outside the integrated circuit IC. Filters of the surface acoustic wave type are known per se to the person skilled in the art. It will, for example, here be possible to use a filter exhibiting a center frequency of 1220 MHz, such as that marketed by the German company EPCOS AG, under the reference B 1610. This filter FSAW is by nature relatively steep and consequently makes it possible to eliminate a large number of undesired adjacent channels situated on either side of the desired channel $CN_i$. By way of indication, the EPCOS B 1610 filter exhibits a passband of 20 MHz. Given the fact that the width of a channel is of the order of 8 MHz, the output signal from the filter FSAW will comprise the desired channel CNi and two or three immediately adjacent channels, as is also illustrated diagrammatically in FIG. 2.

On output from the filter FSAW, the signal is amplified in a controlled-gain amplifier AGC. Then, this signal undergoes a second conversion, this time a downconversion, within a second frequency transposition stage here formed of two mixers MX2I and MX2Q, respectively receiving two frequency transposition signals OL2 mutually out of phase by 90°. These frequency transposition signals OL2 emanate for example also from a voltage-controlled oscillator VCO2. The frequency of the second transposition signal OL2 is equal to the first transposition frequency, that is to say here 1220 MHz. The second frequency transposition is therefore here of the type with zero intermediate frequency since it will bring the signal directly back to baseband. Stated otherwise, two baseband quadrature analog signals, that is to say ones exhibiting the desired channel centered around the zero frequency, are obtained at the output of the two mixers MX2I and MX2Q, on the two processing paths I and Q.

In the subsequent text, only one of the two processing paths will now be described, for example the I path, it being understood of course that the Q path exhibits an analogous structure.

At the output of the mixer MX2I is disposed an analog filter FBBI whose template has been diagrammatically represented in FIG. 3. In this figure, the reference F1, equal to 6 MHz, represents the frequency half-width of the channel CNi. The person skilled in the art is aware that this frequency half-width in fact corresponds to the theoretical frequency half-width of a channel (for example 4 MHz) multiplied by a coefficient known as "roll off", and which is for example equal to 1.35.

The baseband filter FBBI has an upper cutoff frequency equal to F2. According to the invention, this frequency F2 is chosen to be at least 20% greater than the frequency half-width F1 of the channel $CN_i$. By way of indication, it will for example be possible to choose an upper cutoff frequency F2 of each baseband filter FBB equal to around 8 MHz. Thus, a filtered signal comprising the information ICN conveyed by the selected channel, and so-called "adjacent channel residual information" IACD are obtained at the output of these two baseband filters FBBI and FBBQ.

The person skilled in the art will consequently have appreciated that this analog filter, which is for example a filter of order 6, is a relatively soft filter, in the sense that it allows through adjacent channel information. However, the use of a soft analog filter allows easy integration thereof on silicon.

The analog signals at the output of the filters FBBI and FBBQ are digitized in analog/digital converters CANI and CANQ, which exhibit for example here a sampling frequency of the order of 100 MHz with a resolution of the order of 14 bits.

The internal structure of the digital block BNM will now be described in greater detail. In addition to the control means CTL, which may for example be embodied in software form within a microcontroller, and are intended to control the amplifier AGC, the block BNM comprises at the head end correction means MCOR intended to correct defects of phase- and amplitude-pairing of the two processing paths I and Q. Such correction means are known per se to the person skilled in the art. The latter may refer, for whatever purpose it may serve, to U.S. Pat. No. 6,044,112, or to French Patent Application No. 02 03256 in the name of the applicant.

Figure 4:
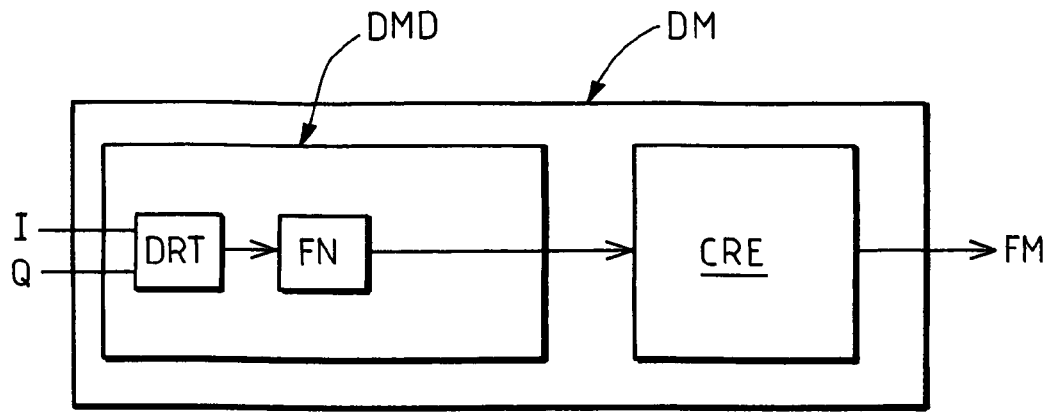
FIG. 4 diagrammatically illustrates in greater detail the internal structure of a channel decoding module of a component according to the invention.

The digital block BNM next comprises a channel decoding module DM, an example of the structure of which is illustrated more particularly in FIG. 4. More precisely, this channel decoding digital module DM comprises a demodulation stage DMD capable of performing conventional demodulation processing, followed by an error correction stage CRE performing conventional Viterbi decoding processing, deinterleaving, Reed-Solomon decoding deshuffling, so as to deliver the packet FM that will be decoded in a source decoding block external to the component CMP, and in accordance with the MPEG standard for example.

The demodulation stage DMD diagrammatically comprises at the head end correction means DRT (Derotator) able to correct the phase noise, the frequency drift and the frequency offset of the frequency synthesizers. The correction means DRT are also used here according to the invention to compensate for the bandpass filtering FBBI, FBBQ and thus avoid obtaining too low an error margin for the interpretation of the constellation. Such means of derotation may for example be those described in European Patent Application No. 0,481,543.

The analog filtering is here supplemented with Nyquist filtering performed in a digital filter FN, whose cutoff frequency is equal to the frequency half-width F1 of the desired channel. The filter FN consequently supplements the filtering performed by the filter FSAW and the bandpass filter FBBI, FBBQ, and thus eliminates the adjacent channel information.

The error correction stage CRE next performs conventional error correction processing that is well known to the person skilled in the art by the terminology FEC (Forward Error Correction).

Figure 5:
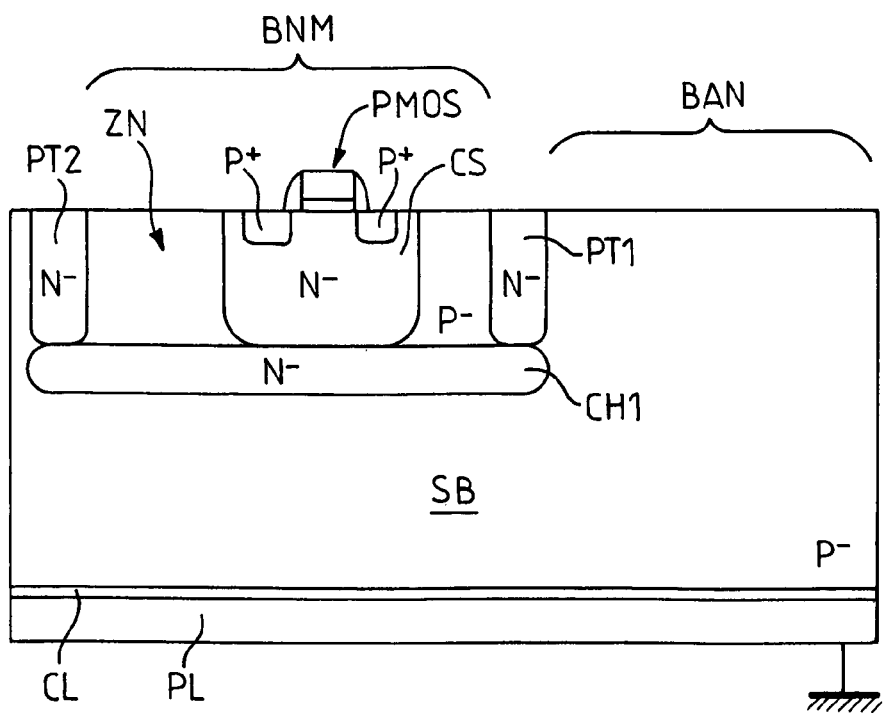
FIG. 5 diagrammatically illustrates a technological embodiment of a component according to the invention.

Technologically, the integrated circuit IC according to the invention is embodied, for example in 0.18 µm CMO technology, on a monolithic substrate SB made of silicon, for example of $P^-$ type (FIG. 5). To absorb the high-frequency current spikes, it is preferable to glue a metal plate PL onto the rear face of the substrate SB by means of a conventional conducting glue CL. This metal plate is intended to be grounded. The fine layer of oxide which forms naturally on the silicon of the substrate forms the dielectric of a capacitor whose two electrodes are formed respectively by the substrate SB and the metal plate PL. This capacitor, whose capacitance is relatively large, thus makes it possible to absorb the high-frequency current spikes.

Moreover, the digital part of the component CMP, that is to say in this instance the digital block BNM, is made in a region ZN of the substrate which is isolated from the remainder of the substrate (in which region the analog part BAN of the component is made) by an $N^-$-doped semiconducting barrier formed here of a buried layer CH1 and two wells PT1 and PT2.

Moreover, the PMOS transistors of the digital part are made within an $N^-$ well which comes into contact with the buried layer CH1.

Also, in order to prevent the noise on the supply voltage Vdd from being transmitted via the $N^-$ wells to the analog part, so that it directly disturbs in particular the amplifier LNA, it is advantageous to bias all the $N^-$ wells with a bias voltage different from that supplying the transistors situated in this isolated region ZN of the substrate.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. Apparatus, comprising:
a surface acoustic wave filter; and
an integrated circuit embodied on a single monolithic substrate in which each of the following circuit components are fabricated on that single monolithic substrate:
an input adapted to receive an analog signal including a plurality of channels;
an upconversion device to upconvert the received analog signal;
a first port for off substrate connection to an input of the surface acoustic wave filter and coupled to receive the upconverted analog signal for application to the surface acoustic wave filter;
a second port for off substrate connection to an output of the surface acoustic wave filter to receive a filtered upconverted signal from the surface acoustic wave filter; and
a downconversion device coupled to the second port to downconvert the filtered upconverted signal to a baseband signal centered at zero frequency;
a baseband filtering circuit that filters the baseband signal to generate a filtered analog baseband signal, the baseband filtering circuit having an upper cutoff frequency greater than a frequency half-width of one channel;
an analog-to-digital converter circuit that converts the filtered analog baseband signal to a digital baseband signal, the analog-to-digital converter circuit having a sampling frequency which is at least ten times the upper cutoff frequency of the baseband filtering circuit; and
a digital baseband decimating filter that filters the digital baseband signal to generate a filtered digital baseband signal;
wherein the single monolithic substrate further includes an oxide layer on a rear surface of the substrate, the apparatus further comprising: a metal plate glued to the oxide layer on the rear surface of the substrate to form a first plate of a capacitor, wherein a second plate of the capacitor is formed by the single monolithic substrate.

2. The apparatus of claim 1 wherein the digital baseband decimating filter is a Nyquist digital filter having a cutoff frequency equal to the frequency half-width of one channel.

3. The apparatus of claim 1, wherein the device is a receiver of digital terrestrial or cable television signals.

4. The apparatus of claim 1, wherein the analog signal is one of a digital terrestrial or cable television signal.

5. The apparatus of claim 1, wherein the first and second ports carry signals on and off, respectively, the integrated circuit substrate.

6. The apparatus of claim 1 wherein the channels of the analog signal extend over a frequency span and wherein the upconversion device upconverts the received analog signal to a frequency that is higher than an upper limit of the frequency span.

7. The apparatus of claim 6 wherein the upconversion device upconverts the received analog signal to a frequency that is the sum of a desired channel frequency plus the upper limit of the frequency span.

8. The apparatus of claim 1 wherein the surface acoustic wave filter is a bandpass filter having a pass band of at least two times a frequency width of one channel.

9. The apparatus of claim 1 wherein the integrated circuit substrate additionally includes the following circuit component: means for delivering a stream of data packets corresponding to information in a desired channel of the analog signal from the filtered digital baseband signal.

10. The apparatus of claim 1 wherein the metal plate is a grounded metal plate and the capacitor functions to absorb high-frequency current spikes.

11. Apparatus, comprising:
a surface acoustic wave filter; and
an integrated circuit embodied on a single monolithic substrate in which each of the following circuit components are fabricated on that single monolithic substrate:
an input adapted to receive an analog signal including a plurality of channels;
an upconversion device to upconvert the received analog signal;
a first port for off substrate connection to an input of the surface acoustic wave filter and coupled to receive the upconverted analog signal for application to the surface acoustic wave filter;
a second port for off substrate connection to an output of the surface acoustic wave filter to receive a filtered upconverted signal from the surface acoustic wave filter; and
a downconversion device coupled to the second port to downconvert the filtered upconverted signal to a baseband signal centered at zero frequency;
a baseband filtering circuit that filters the baseband signal to generate a filtered analog baseband signal, the baseband filtering circuit having an upper cutoff frequency greater than a frequency half-width of one channel;
an analog-to-digital converter circuit that converts the filtered analog baseband signal to a digital baseband signal, the analog-to-digital converter circuit having a sampling frequency which is at least ten times the upper cutoff frequency of the baseband filtering circuit; and
a digital baseband decimating filter that filters the digital baseband signal to generate a filtered digital baseband signal;
wherein the single monolithic substrate has a first type of conductivity, and wherein elements performing digital processing are disposed in a part of the substrate that is isolated from the remaining part of the substrate by a semiconducting barrier having a second type of conductivity different from the first type of conductivity, and wherein the semiconducting barrier is adapted to be biased by a bias voltage different from that supplying the isolated part of the substrate.

12. A circuit, comprising:
an input adapted to receive an analog signal including a plurality of channels;
an upconversion device adapted to upconvert the received analog signal;
a bandpass filter adapted to filter the received analog signal and generate a filtered upconverted signal comprising information from at least one channel, wherein the bandpass filter is a surface acoustic wave filter;
a downconversion device adapted to downconvert the filtered upconverted signal to an analog baseband signal centered at zero frequency;
an analog low pass filter adapted to filter the analog baseband signal and generate a filtered analog baseband signal, the analog low pass filter having an upper cutoff frequency greater than a frequency half-width of one channel;

an analog-to-digital converter adapted to convert the analog baseband signal to a digital baseband signal, the analog-to-digital converter having a sampling frequency which is at least ten times the upper cutoff frequency of the second filter; and a digital decimating low pass filter adapted to filter the digital baseband signal and generate a filtered digital baseband signal, the digital decimating low pass filter having a cutoff frequency substantially equal to the frequency half-width of one channel;

wherein all of the recited components of the circuit, with the exception of the surface acoustic wave filter, are implemented on a single integrated circuit chip and the surface acoustic wave filter is connected to the single integrated circuit chip as an off-chip component;

wherein the single integrated circuit chip further includes an oxide layer on a rear surface of a substrate of the chip, the apparatus further comprising: a metal plate glued to the oxide layer on the rear surface of the substrate to form a first plate of a capacitor, wherein a second plate of the capacitor is formed by the substrate.

13. The circuit of claim 12 wherein the metal plate is a grounded metal plate and the capacitor functions to absorb high-frequency current spikes.

14. The circuit of claim 12, further including means for decoding the filtered digital baseband signal to deliver a stream of data packets corresponding to information in a selected one of the channels.

15. The circuit of claim 12, wherein the upconversion device and downconversion device in combination comprises a zero intermediate frequency dual conversion tuner.

16. A circuit, comprising:
an input adapted to receive an analog signal including a plurality of channels;
an upconversion device adapted to upconvert the received analog signal;
a bandpass filter adapted to filter the received analog signal and generate a filtered upconverted signal comprising information from at least one channel, wherein the bandpass filter is a surface acoustic wave filter;
a downconversion device adapted to downconvert the filtered upconverted signal to an analog baseband signal centered at zero frequency;
an analog low pass filter adapted to filter the analog baseband signal and generate a filtered analog baseband signal, the analog low pass filter having an upper cutoff frequency greater than a frequency half-width of one channel;
an analog-to-digital converter for converting the analog baseband signal to a digital baseband signal, the analog-to-digital converter having a sampling frequency which is at least ten times the upper cutoff frequency of the second filter; and
a digital decimating low pass filter adapted to filter the digital baseband signal and generate a filtered digital baseband signal, the digital decimating low pass filter having a cutoff frequency substantially equal to the frequency half-width of one channel;
wherein all of the recited components of the circuit, with the exception of the surface acoustic wave filter, are implemented on a single integrated circuit chip and the surface acoustic wave filter is connected to the single integrated circuit chip as an off-chip component;

wherein the single integrated circuit chip is formed of a substrate having a first type of conductivity, and wherein elements performing digital processing are disposed in a part of the substrate that is isolated from the remaining part of the substrate by a semiconducting barrier having a second type of conductivity different from the first type of conductivity, and wherein the semiconducting barrier is adapted to be biased by a bias voltage different from that supplying the isolated part of the substrate.

17. An electronic component, comprising:
a tuning module of the zero intermediate frequency dual conversion, upconversion stage then downconversion stage, type having:
an input adapted to receive digital terrestrial or cable television analog signals composed of several channels,
a bandpass filter of the surface acoustic wave type disposed between the upconversion and downconversion stages and adapted to output a filtered analog signal containing information of a desired channel and adjacent channel information, and
a baseband filtering stage disposed on two quadrature output paths of the downconversion stage adapted to perform a low pass filtering of the adjacent channel information, the baseband filtering stage having an upper cutoff frequency greater than a frequency half-width of the desired channel;
a multibit analog/digital conversion stage coupled to an output of the baseband filtering stage, the multibit analog/digital conversion stage having a sampling frequency which is at least ten times the upper cutoff frequency of the baseband filtering stage; and
a digital processing block comprising:
a stage adapted to correct the defects of phase- and amplitude-pairing of the two quadrature output paths, and
a channel decoding digital module, linked to the output of the stage adapted to correct defects, and comprising:
a demodulation stage,
a digital decimation filtering stage having a cutoff frequency substantially equal to the frequency half-width of the desired channel adapted to eliminate the adjacent channel information, and
an error correcting stage adapted to deliver a stream of data packets corresponding to the information conveyed by the desired channel.

18. The component according to claim 17, wherein, with the exception of the surface acoustic wave filter of the tuning module, all circuits within the tuning module, the analog/digital conversion stage and the digital processing block are disposed within an integrated circuit that is fabricated on a single monolithic substrate.

19. The component according to claim 18, wherein the single integrated circuit chip further includes an oxide layer on a rear surface of a substrate of the chip, the apparatus further comprising:
a metal plate glued to the oxide layer on the rear surface of the substrate to form a first plate of a capacitor, wherein a second plate of the capacitor is formed by the substrate.

20. The component according to claim 19, wherein the metal plate is a grounded metal plate and the capacitor functions to absorb high-frequency current spikes.

21. The component according to claim 18, wherein the single integrated circuit chip is formed of a substrate having a first type of conductivity, and wherein elements performing digital processing are disposed in a part of the substrate that is isolated from the remaining part of the substrate by a semiconducting barrier having a second type of conductivity different from the first type of conductivity, and wherein the semiconducting barrier is adapted to be biased by a bias voltage different from that supplying the isolated part of the substrate.

22. The component according to claim 17, wherein the first frequency transposition stage is able to receive a first transposition signal having a frequency equal either to the sum of the frequency of the desired channel and of a first transposition frequency greater than the upper limit of the said frequency span, or the difference between the said first transposition frequency and the frequency of the desired channel, and wherein the second frequency transposition stage is able to receive a second transposition signal having the said first transposition frequency, in that the passband of the surface acoustic wave filter is of the order of two to three times the frequency width of a channel, and wherein the bandpass filtering stage possesses an upper cutoff frequency around 20% greater than the frequency half-width of a channel.

23. The component according to claim 22, wherein the passband of the surface acoustic wave filter is of the order of 20 MHz.

24. The component according to claim 17, wherein the resolution of the multibit analog/digital conversion stage is greater than or equal to 4 bits.

* * * * *